United States Patent [19]

Kuhn et al.

[11] Patent Number: 4,873,486

[45] Date of Patent: Oct. 10, 1989

[54] MAGNETIC RESONANCE SPECTROMETER

[75] Inventors: Michael H. Kuhn, Hamburg; Thomas Helzel, Kaltenkirchen; Roland Proksa, Hamburg, all of Fed. Rep. of Germany; Noel J. M. Van Den Berg, Putte, Netherlands

[73] Assignee: U.S. Philips Corp., New York, N.Y.

[21] Appl. No.: 241,635

[22] Filed: Sep. 8, 1988

[30] Foreign Application Priority Data

Sep. 10, 1987 [DE] Fed. Rep. of Germany ....... 3730293

[51] Int. Cl.$^4$ ............................................ G01R 33/20
[52] U.S. Cl. .................................... 324/307; 324/318
[58] Field of Search ............... 324/307, 314, 318, 322; 307/522, 529; 328/23, 166, 167; 455/316

[56] References Cited

U.S. PATENT DOCUMENTS

| | | | |
|---|---|---|---|
| 3,646,429 | 2/1972 | Takeuchi et al. | 324/314 |
| 3,886,439 | 5/1975 | Laukien | 324/314 |
| 4,297,637 | 10/1981 | Crooks et al. | 342/309 |
| 4,551,856 | 11/1985 | Victor et al. | 455/316 |

Primary Examiner—Thomas P. Noland
Assistant Examiner—Kevin D. O'Shea
Attorney, Agent, or Firm—Thomas A. Briody; Jack E. Haken; Jack D. Slobod

[57] ABSTRACT

A magnetic resonance spectrometer in which, at least in the receiving branch, the received spin resonance signal is transposed by successive mixing processes into a transposed signal having a higher frequency range than the baseband. The transposed signal is converted into a digital signal by an analog-to-digital converter.

16 Claims, 2 Drawing Sheets

MAGNETIC RESONANCE SPECTROMETER

BACKGROUND OF THE INVENTION

1. Field of the Invention

The invention relates to a magnetic resonance spectrometer in which at least two mixing stages are provided in the receiving branch in order to transpose the spin resonance signals into a lower frequency range, and in which an analog-to-digital converter converts the spin resonance signals thus transposed into the lower frequency range into a series of digital data words, the sampling frequency being at least twice as high as the highest frequency in the transposed spin resonance signal.

2. Description of the Related Art

A spectrometer of this kind is known from West German patent DE-OS 2 928 551 corresponding to U.S. Pat. No. 4,297,637, notably from FIG. 13. During each mixing operation in such a spectrometer, not only the signals from the useful frequency range are transposed into the frequency range of the output signal, but also signals from the mirror frequency range. (As is known, the mirror frequency is that frequency which is situated at the same frequency distance as the useful frequency from the mixing frequency with which the useful frequency is mixed). The noise and interference signals in the mirror frequency range, therefore, must be suppressed by means of a filter arranged in the signal path preceding the mixing stage. The requirements imposed on this filter are comparatively low in the known spectrometer, because the first frequency with which the spin resonance signal is mixed is substantially higher than the Larmor frequency, so that the mirror frequency range can be suppressed by means of a filter having a slope which is not very steep.

In the second mixing stage, the output signal of the first mixing stage is mixed down to the baseband. To this end, the second mixing stage is constructed as a quadrature mixer in which the output signal of the first mixing stage is multiplied by two signals which have been shifted through 90° with respect to one another and whose frequency corresponds exactly to the mean value in time of the output signal of the first mixing stage. As a result of this mixing operation it is avoided that interference or noise situated outside the frequency range of the spin resonance signal is transposed into the base band.

However, this advantage is obtained at the expense of a number of drawbacks. The quadrature mixer must have an exactly symmetrical construction and the phase shift between the two sinusoidal signals must amount to exactly 90°. It is comparatively complex to satisfy these requirements in an analog mixing stage. A further drawback consists in that the lowest useful frequency in the baseband is so low that, a d.c. amplifier must be used to amplify the output signal of the quadrature mixer. Shifts of the operating point of this amplifier causes a disturbing drift which causes reconstruction errors during the further processing of the signal. Moreover, the low-frequency 1/f noise as well as harmonics of the mains frequency have a particularly disturbing effect in the baseband.

SUMMARY OF THE INVENTION

It is an object of the present invention to construct a spectrometer of the kind set forth so that the described problems imposed by the transposition in the baseband are avoided, without the mixing operations transposing additional noise into the useful frequency range and without complex filters being required in the receiving branch.

This object is achieved in accordance with the invention in that in the first mixing stage the spin resonance signal is mixed with a first frequency in the vicinity of the Larmor frequency, and in that in a second mixing stage which succeeds the first mixing stage the output signal of the first mixing stage is mixed with a second frequency which deviates from the absolute value of the frequency distance between the Larmor frequency and the first frequency and which is substantially lower than the first frequency.

In the spectrometer in accordance with the invention, the useful signal is not transposed into the baseband by the two-fold (or more) mixing, but into a higher frequency range. Consequently, in the analog part of the spectrometer d.c. uncoupled stages can be used so that the d.c. drift problem is eliminated. Similarly, interference due to harmonics of the mains frequency and the so-called 1/f noise is suppressed, because the useful frequency range is higher than the frequency range of such interference.

As a result of the two-fold mixing, the useful frequency band can be transposed into a frequency range which can still be processed with the required resolution (15 bits) by commercially available analog-to-digital converters, without noise or interference present outside the useful frequency band being significantly transposed to the useful frequency band by the two-fold mixing operation and without excessive filtering being required.

In an embodiment in accordance with the invention, the second frequency for the second mixing stage (and possibly for further mixing stages) is higher than the (relevant) useful frequency. In that case the filtering at the input of the mixing stage can be performed by means of a low-pass filter (instead of a band-pass filter) which suppresses on the one hand the mirror frequency range and on the other hand the sum frequency on the output of the preceding mixing stage.

In a further embodiment in accordance with the invention, the transmission branch includes a signal generator in which a carrier is modulated with a third frequency which is lower than half the sampling frequency of the analog-to-digital converter, the output signal of the signal generator being mixed with the same frequencies as the spin resonance signal in the receiving branch. This embodiment enables the same use of the first and the second frequencies for mixing in the receiving branch as in the transmission branch.

In another embodiment of the invention, the first and the second frequency as well as the sampling frequency are chosen so that the frequency distance between the first or the second frequency and the highest signal frequency yet to be transmitted on the input of the associated mixer, divided by the first or the second frequency, respectively corresponds at least approximately to the frequency distance between half the sampling frequency and the highest signal frequency yet to be converted by the analog-to-digital converter, divided by half the sampling frequency. It is thus achieved that the requirements imposed as regards the slope steepness of the filters arranged at the inputs or outputs of the mixing stages are the same, so that overall the least complex filtering effort is required.

In another embodiment of the invention, generators supplying the first and the second frequency as well as the sampling frequency are synchronised by means of a common reference oscillator. As a result, the relationship between all frequencies is fixed so that phase noise is substantially eliminated.

BRIEF DESCRIPTION OF THE DRAWINGS

The invention will be described in detail hereinafter with reference to the drawings. Therein.

DESCRIPTION OF THE PREFERRED EMBODIMENT

Figure 1:
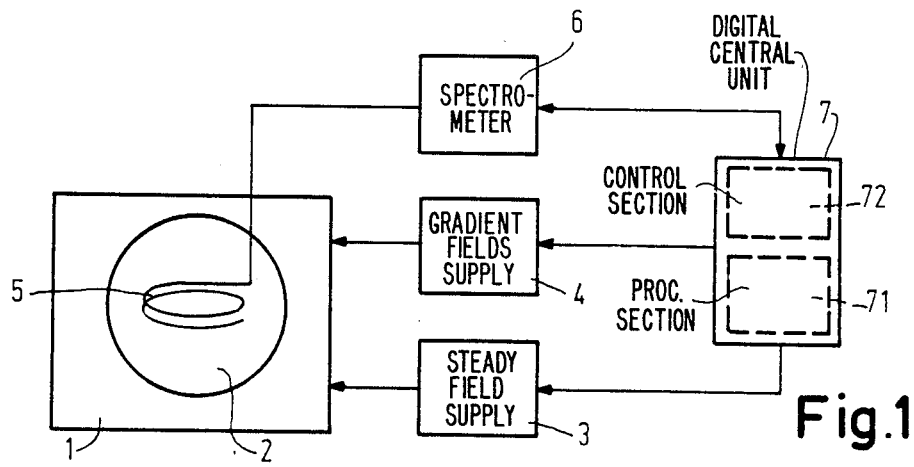
FIG. 1 shows a magnetic resonance tomography apparatus in which the invention can be used.

The reference numeral 1 in FIG. 1 denotes a device which generates a uniform and steady magnetic field of, for example 0.5 T in an examination zone 2 which extends perpendicularly to the plane of a drawing; if desired, the device 1 also generates gradient fields, i.e. magnetic fields which extend in the same direction as the steady uniform magnetic field but whose strength varies linearly in the direction of the magnetic field or in a direction perpendicular thereto. To this end, the device 1 is coupled to a generator or supply 3 which generates the steady magnetic field and to a generator or supply 4 which supplies the currents for the various magnetic gradient fields. There is also provided an r.f. coil which generates an r.f. magnetic field which extends perpendicularly to the steady magnetic field and which is connected to an output of a spectrometer 6. During transmission, the spectrometer supplies the r.f. energy for the r.f. coil 5 and in the receiver mode it processes the spin resonance signals induced in this coil.

The generators 3 and 4 and the spectrometer 6 are controlled by a digital central unit 7 which comprises a control section 71 for this purpose. The digital central unit also comprises a processing section 72 which processes the data supplied by the spectrometer 6 and which reconstructs the nuclear magnetization distribution in the examination zone 2 on the basis thereof.

Figure 2:
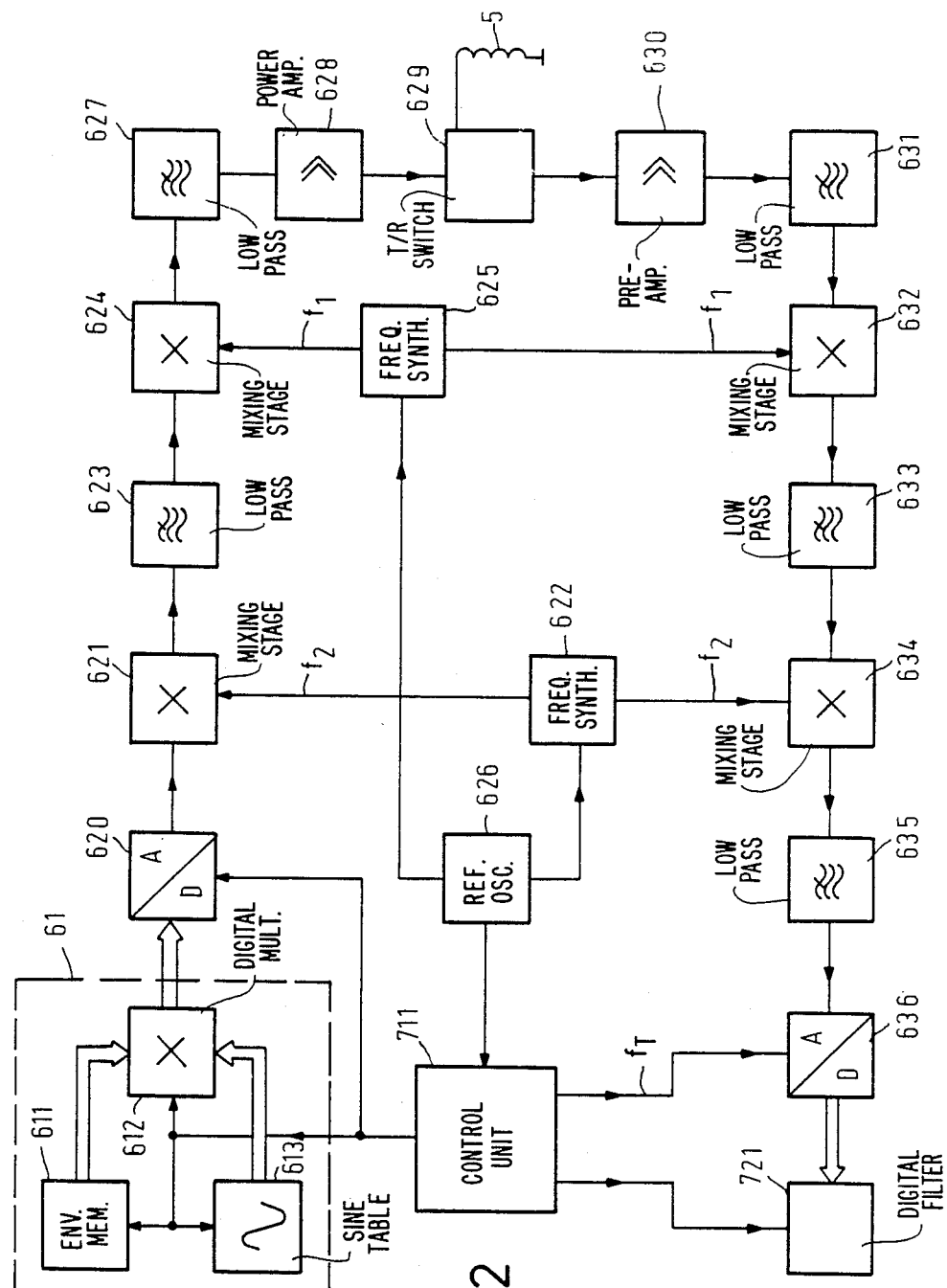
FIG. 2 shows the block diagram of a spectrometer in accordance with the invention.

As appears from FIG. 2, the spectrometer comprises a signal generator 61 whose output supplies a series of digital data words which represents an envelope signal modulated on a carrier of 102.45 kHz. The envelope signal defines the variation in time of the envelope of the r.f. pulse generated by the coil 5. It is derived from an envelope memory 611 included in the signal generator and is multiplied in a digital multiplier 612 by a sinusoidal signal having a carrier frequency of 102.45 kHz. This signal is derived from a table memory (look-up table) 613 in which a sine table is stored. The clock frequency for reading the memories 611 and 613, being substantially higher than the carrier frequency of 102.45 kHz, is supplied by an execution control unit 711 which forms part of the control unit 71.

The digital signal of the signal generator 61 is applied to a digital-to-analog converter 620. The analog output signal of this converter, formed by a filter (not shown), is mixed in a mixing stage 621 with a signal which is generated by a frequency synthesizer 622 and whose frequency $f_2$ amounts to approximately 1.35 MHz. On the output of the mixing stage 621 there appears a differential frequency band (approximately 1.24755 MHz) as well as a sum frequency band. A low pass filter 623 conducts the differential frequency band and substantially suppresses the sum frequency band. The output signal of the low-pass filter signal is applied to a further mixing stage 624 in which it is mixed with a frequency $f_1 = 22.54$ MHz.

The mixing frequency $f_1$ is generated by a synthesizer 625 which is synchronised, like the synthesizer 622 by a reference oscillator 626 which oscillates at, for example 10 MHz. Phase noise is substantially precluded by this synchronization operation.

The output signal of the mixing stage 624 again comprises a sum frequency band which is substantially eliminated by a low pass filter 627, and a differential frequency band which is amplified in a power amplifier 628 after having traversed the low pass filter 624. The differential frequency amounts to 21.29245 MHz. This is the Larmor frequency for hydrogen protons in a steady magnetic field of 0.5 T. The differential frequency band is applied, via a switching device 629, to the r.f. coil 5 which thus generates a magnetic r.f. pulse.

In the receiver mode, i.e. after excitation of the examination zone or a part thereof by one or more r.f. pulses, the switch 629 is switched over so that the spin resonance signals induced in the r.f. coil 5 are applied to a pre-amplifier 630. The frequency of the spin resonance signals amounts to approximately the spin resonance frequency (21.29245 MHz), the maximum bandwidth of the spin resonance signals depending on the size of the examination zone and on the gradient of the magnetic gradient field; a typical bandwidth value is 60 kHz. The upper useful frequency amplified in the pre-amplifier 630 thus amounts to 21.32245 MHz.

The output signal of the pre-amplifier 630 is applied, via a filter 631, to an input of a mixing stage 632, the other mixing input of which receives the output signal of the synthesizer 625, which output signal has the frequency $f_1$.

Figure 3A:
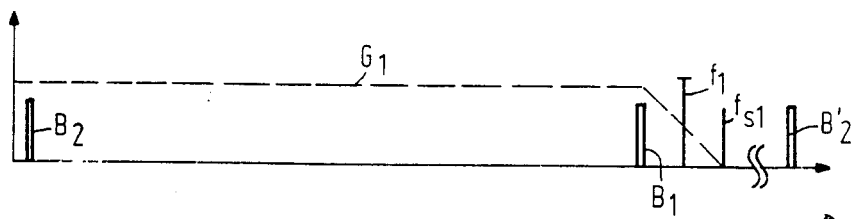
FIGS. 3a–3c show the spectra at various inputs and outputs of the mixing stages and at the input to an analog-to-digital converter.

FIG. 3a shows the spectra of the signals on the inputs and outputs of the mixing stage 632, the useful frequency band input to mixing stage 632 being denoted by the reference numeral $B_1$. The mixing operation produces a differential frequency band $B_2$ at the output of mixing stage 632 and a sum frequency band $B'_2$. During the mixing operation, not only the useful frequency band is transposed into the bands $B_2$ and $B'_2$, but also noise and other interference in the mirror frequency band. The image frequency band covers those frequencies whose frequency distance from the carrier $f_1$ is exactly equal to the frequency distance between the useful signals in $B_1$ from this carrier. The lowest mirror frequency is referred to as $f_{S1}$ in FIG. 3a. For the present example, it amounts to 23.75755 MHz. Therefore, the filter 631 must be constructed so that it conducts the useful frequency band $B_1$ without attenuation and suppresses the frequency $f_{S1}$ and all higher mirror frequencies. To this end, this filter is preferably constructed as a low-pass filter whose frequency response is represented by the dashed curve $G_1$ in FIG. 3a.

Figure 3B:
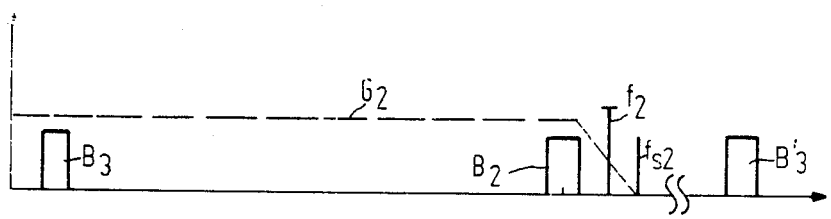

The output signal of the mixing stage 632 is applied, via a filter 633 which is constructed as a low pass filter, to a further mixing stage 634 in which it is mixed with the second frequency $f_2$. The spectrum on the inputs and outputs of this mixing stage is shown in FIG. 3b, be it at an increased scale as indicated by the stroke-dot line. Analogously to the mixing stage 632, a differential frequency band $B_3$ (102.45 kHz) and a sum frequency band $B'_3$ are again generated during the mixing operation. The lowest mirror frequency $f_{S2}$ in this case ($f_2=1.35$ MHz) amounts to 1.42245 MHz. Therefore, the low-pass filter 633 must be constructed so that it conducts the frequency band $B_2$ without attenuation and suppresses the mirror frequency $f_{S2}$ as well as possible. The reference numeral $G_2$ in FIG. $3b$ denotes the necessary frequency response curve. This low pass filter at the same time fully suppresses the sum frequency band $B'_2$ on the output of the first mixing stage.

Figure 3C:
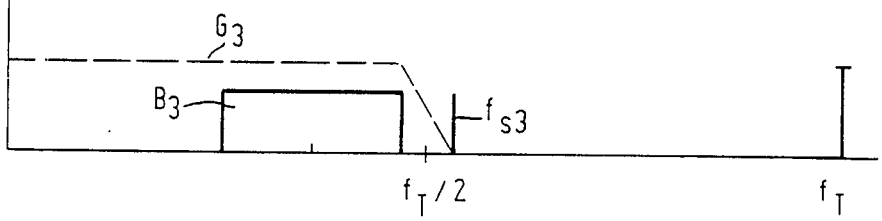

The output signal of the mixing stage 634 is applied, via a low pass filter 635, to an analog-to-digital converter 636 whose sampling frequency $f_T$ amount to 280 kHz. In accordance with the sampling theorem, an analog-to-digital converter of this kind is capable of digitizing signals having a frequency of up to 140 kHz. The band $B_3$ is situated in this frequency range (72.45 kHz to 132.45 kHz). Signals whose frequency exceeds twice the sampling frequency are folded into the useful frequency band below 140 kHz by the sampling process (aliasing effect), be it that their frequency distance from half the carrier frequency is maintained. Therefore, it is necessary to suppress the frequency $f_{S3}$ (and all higher frequencies) which, beyond 140 kHz, has the same frequency distance from half the carrier frequency as the highest frequency (132.45 kHz) of the useful band; thus, the low pass filter 635 must suppress the frequency $f_{S3}=147.55$ kHz and all higher frequencies. The necessary frequency response curve is denoted by the reference numeral $G_3$, in FIG. 3.

The output signal of the analog-to-digital converter is subsequently processed in a digital filter 721 which forms part of the control section 72 (FIG. 1). In this filter, all interference frequency components which are situated below the frequency band $B_3$ are suppressed, for example harmonics of the mains frequency etc. After a Fourier transformation of the filtered, digitized signal, further signal processing can be performed in known manner in the unit 72. Like the clock frequency for the signal generator 61, the clock frequencies for the digital filter 721 and the analog-to-digital converter 636 are also synchronized with the frequency of the reference oscillator.

It will be apparent that, for example, the complexity of the filter 631 could be reduced if the first frequency $f_1$ were 250 kHz higher; the distance between the upper frequency of the useful band $B_1$ and the lower mirror frequency $f_{S1}$ would then be 500 kHz greater. However, the differential frequency band $B_2$ would then also be 250 kHz higher and the second frequency $f_2$ should then also be 250 kHz higher for the position of the frequency band $B_3$ to remain the same. The lowpass filter 633 should then have comparatively steeper slopes because the frequency distance relative to the frequency $f_2$ would be reduced. The complexity of the filter 633 could also be reduced if $f_2$ were slightly increased for the same position of the band $B_2$. This would make the requirements imposed on the low-pass filter 635 more severe. Because the sampling frequency of the (15-bit) analog-to-digital converter is limited, the frequencies $f_1$ and $f_2$ could still be freely chosen; however, the complexity of the filters 631 to 635 would then be influenced as appears from the above considerations.

Therefore, the frequencies $f_1$ and $f_2$ are chosen so that the relative slope steepnesses of all filters are the same. Relative slope steepness is to be understood to mean herein the quotient of the difference of the (highest) useful frequency and the (lowest) mirror frequency, divided by the central frequency ($f_1$, $f_2$ or $f_T/2$). For the filters 631, 633 and 635 this quotient amounts to approximately 0.108. For suppression of the undesirable frequencies by, for example 20 dB, these filters would have to be at least of the $22^{nd}$ order. If the complexity of one of these filters were changed by shifting the frequencies $f_1$ and/or $f_2$, the complexity of at least one other filter would have to be substantially increases, so that the overall complexity would increase.

If the frequency $f_1$ of the output signal of the synthesizer were to have a value 20.04484 MHz which is situated 1.24755 MHz below the Larmor frequency (21.29245 MHz), the position of the differential band $B_2$ would not change. In that case a high pass filter would be required for suppressing the mirror frequencies. Moreover, the frequency band $B_3$ would then appear in the reciprocal position, i.e. the highest frequency component of the spin resonance signal would be situated in the lowest position in the band $B_3$ (and vice versa); however, this fact could be taken into account during the further processing of the Fourier transformed signal.

If the second mixing frequency were generated below the band $B_2$, the band $B_3$ would appear in the normal position on the input of the analog-to-digital converter. In this case, however, it would not be sufficient to use a high-pass filter for the input filter 633 preceding the second mixing stage, because this filter should also suppress the sum frequency band. Therefore, the filter should either be constructed as a bandpass filter of a very high order, which is rather complex, or the sum frequency band $B'_2$ on the output of the mixing stage 632 should be suppressed by means of an additional low-pass filter which, however, could have a comparatively simple construction.

What is claimed is:

1. A magnetic resonance spectrometer comprising a receiving branch in which means, including successive first and second mixing stages is provided for transposing a received spin resonance signal having a first frequency band ($B_1$) of useful frequencies into a lower third frequency band ($B_3$) having a lowest useful frequency greater than zero and in which an analog-to-digital converter (636) converts the spin resonance signal thus transposed into the lower frequency range band ($B_3$) into a series of digital data words, said analog-to-digital converter having a sampling frequency ($f_t$) at least twice as high as the highest useful frequency in the lower frequency band ($B_3$) characterized in that in the first mixing stage (632) the spin resonance signal is mixed with a first frequency (f1) in the vicinity of the Larmor frequency, but lying outside of said first frequency band ($B_1$) in order to produce an output signal in which said first frequency band ($B_1$) is transposed to a second frequency band ($B_2$) substantially lower than said first frequency band ($B_1$), and in that in the second mixing stage (634) the output signal of the first mixing stage is mixed with a second frequency (f2) substantially lower than the first frequency (f1) in the vicinity of but lying outside of said second frequency band ($B_2$) in order to reduce an output signal in which said second frequency band ($B_2$) is transposed to a frequency band which is substantially lower than said second frequency band ($B_2$).

2. A magnetic resonance spectrometer as claimed in claim 1, further comprising a transmission branch which includes a signal generator (61) in which a carrier is modulated so as to produce an output signal having a frequency band with a highest frequency which is lower than half the sampling frequency ($f_T/2$) of the analog-to-digital converter (636) and means for successively mixing the output signal of the signal generator with the second frequency ($f_2$) and the first frequency $f_1$ for transposing said generated frequency band into a higher frequency band.

3. A magnetic resonance spectrometer as claimed in claim 1, further comprising means (622, 625, 626, 711) for supplying the first and second frequencies ($f_1$, $f_2$) as well as the sampling frequency ($f_T$) including a common reference oscillator (626) for synchronizing said first, second and sampling frequencies.

4. A magnetic resonance spectrometer as claimed in claim 2, characterized in that the signal generator comprises an envelope memory (611) in which at least one envelope is stored, as well as a sine memory (613), signals derived from the two memories being multiplied in a digital multiplier (612) to from a product signal, the product signal being converted into an analog signal in a digital-to-analog converter (620), which analog signal serves as the output signal of the signal generator (61).

5. A magnetic resonance spectrometer as claimed in claim 1 wherein said second mixing stage transposes said second frequency band ($B_2$) into a third frequency band ($B_3$), said first, second and third frequency band ($B_1$, $B_2$, $B_3$) each having a different highest useful frequency, said first frequency, second frequency and sampling frequency being chosen so that the frequency distance between the first frequency ($f_1$) and the highest useful frequency of said first frequency band ($B_1$), divided by said first frequency ($f_1$), is approximately equal to the frequency distance between the second frequency ($f_2$) and the highest useful frequency of said second frequency band ($B_2$), divided by said second frequency ($f_2$), and is approximately equal to the frequency distance between one half the sampling frequency ($f_T/2$) and the highest useful frequency of said third frequency band ($B_3$), divided by said one half the sampling frequency ($f_T/2$).

6. A magnetic resonance spectrometer as claimed in claim 2 wherein said second mixing stage transposes said second frequency band ($B_2$) into a third frequency band ($B_2$), said first, second and third frequency bands ($B_1$, $B_2$, $B_3$) each having a different highest useful frequency, said first frequency, second frequency and sampling frequency being chosen so that the frequency distance between the first frequency ($f_1$) and the highest useful frequency of said first frequency band ($B_1$), divided by said first frequency ($f_1$), is approximately equal to the frequency distance between the second frequency ($f_2$) and the highest useful frequency of said second frequency band ($B_2$), divided by said second frequency ($f_2$), and is approximately equal to the frequency distance between one half the sampling frequency ($f_T/2$) and the highest useful frequency of said third frequency band ($B_3$), divided by said one half the sampling frequency ($f_T/2$).

7. A magnetic resonance spectrometer as claimed in claim 2, further comprising means (622, 625, 626, 711) for supplying the first and second frequencies ($f_1$, $f_2$) as well as the sampling frequency ($f_T$) including a common reference oscillator (626) for synchronizing said first, second and sampling frequencies.

8. A magnetic resonance spectrometer as claimed in claim 5, further comprising means (622, 625, 626, 711) for supplying the first and second frequencies ($f_1$, $f_2$) as well as the sampling frequency ($f_T$) incluidng a common reference oscillator (626) for synchronizing said first, second and sampling frequencies.

9. A magnetic resonance spectrometer as claimed in claim 6, further comprising means (622, 625, 626, 711) for supplying the first and second frequencies ($f_1$, $f_2$) as well as the sampling frequency ($f_T$) including a common reference oscillator (626) for synchronizing said first, second and sampling frequencies.

10. A magnetic resonance spectrometer as claimed in claim 1, wherein said first and second frequency bands ($B_1$, $B_2$) have highest useful frequencies respectively less than said first and second frequencies ($f_1$, $f_2$), and further comprising a first low pass filter via which said received spin resonance signal is applied to said first mixing stage and a second low pass filter via which the output signal from said first low pass filter is applied to said second mixing stage.

11. A magnetic resonance spectrometer as claimed in claim 2, wherein said first and second frequency bands ($B_1$, $B_2$) have highest useful frequencies respectively less than said first and second frequencies ($f_1$, $f_2$), and further comprising a first low pass filter via which said received spin resonance signal is applied to said first mixing stage and a second low pass filter via which the output signal from said first low pass filter is applied to said second mixing stage.

12. A magnetic resonance spectrometer as claimed in claim 4, wherein said first and second frequency bands ($B_1$, $B_2$) have highest useful frequencies respectively less than said first and second frequencies ($f_1$, $f_2$), further comprising a first low pass filter via which said received spin resonance signal is applied to said first mixing stage and second low pass filter via which the output signal from said first low pass filter is applied to said second mixing stage.

13. A magnetic resonance spectrometer as claimed in claim 5, wherein said first frequency ($f_1$), second frequency ($f_2$) and one half the sampling frequency ($f_T/2$) respectively exceed the highest useful frequencies of said first, second and third frequency bands ($B_1$, $B_2$, $B_3$) and further comprising a first low pass filter via which said received magnetic resonance signal is applied to said first mixing stage, a second low pass filter intermediate the first and second mixing stages and a third low pass filter intermediate said second mixing stage and said analog-to-digital converter.

14. A magnetic resonance spectrometer as claimed in claim 6, wherein said first frequency ($f_1$), second frequency ($f_2$) and one half the sampling frequency ($f_T/2$) respectively exceed the highest useful frequencies of said first, second and third frequency bands ($B_1$, $B_2$, $B_3$) and further comprising a first low pass filter via which said received magnetic resonance signal is applied to said first mixing stage, a second low pass filter intermediate the first and second mixing stages and a third low pass filter intermediate said second mixing stage and said analog-to-digital converter.

15. A magnetic resonance spectrometer as claimed in claim 8, wherein said first frequency ($f_1$), second frequency ($f_2$) and one half the sampling frequency ($f_T/2$) respectively exceed the highest useful frequencies of said first, second and third frequency band ($B_1$, $B_2$, $B_3$) and further comprising a first low pass filter via which said received magnetic resonance signal is applied to said first mixing stage, a second low pass filter intermediate the first and second mixing stages and a third low pass filter intermediate said second mixing stage and said analog-to-digital converter.

16. A magnetic resonance spectrometer as claimed in claim 9, wherein said first frequency ($f_1$), second frequency ($f_2$) and one half the sampling frequency ($f_T/2$) respectively exceed the highest useful frequencies of said first, second and third frequency bands ($B_1$, $B_2$, $B_3$) and further comprising a first low pass filter via which said received magnetic resonance signal is applied to said first mixing stage, a second low pass filter intermediate the first and second mixing stages and a third low pass filter intermediate said second mixing stage and said analog-to-digital converter.

* * * * *